(12) United States Patent
Wong et al.

(10) Patent No.: US 8,050,894 B2
(45) Date of Patent: Nov. 1, 2011

(54) METHOD FOR AUTOMATIC GENERATION OF OPTIMAL SPACE FRAME

(75) Inventors: Shing Yue Samuel Wong, Kowloon (CN); Chun Chung Keith Chan, Kowloon (CN)

(73) Assignee: The Hong Kong Polytechnic University, Kowloon (HK)

( * ) Notice: Subject to any disclaimer, the term of this patent is extended or adjusted under 35 U.S.C. 154(b) by 861 days.

(21) Appl. No.: 11/898,812

(22) Filed: Sep. 17, 2007

(65) Prior Publication Data

US 2009/0073160 A1 Mar. 19, 2009

(51) Int. Cl.
*G06F 17/50* (2006.01)
*G06F 7/60* (2006.01)
*G06F 15/18* (2006.01)
*G06F 17/00* (2006.01)
*G06T 15/00* (2011.01)
*G06T 11/20* (2006.01)

(52) U.S. Cl. .............. 703/1; 703/2; 706/13; 345/418; 345/419; 345/440

(58) Field of Classification Search .............. 703/1, 2; 345/418, 419, 440; 706/13
See application file for complete search history.

(56) References Cited

U.S. PATENT DOCUMENTS

| | | | | |
|---|---|---|---|---|
| 5,819,244 | A * | 10/1998 | Smith | 706/13 |
| 7,181,702 | B2 * | 2/2007 | Horn | 716/2 |
| 7,243,056 | B2 * | 7/2007 | Olhofer et al. | 703/7 |
| 7,734,423 | B2 * | 6/2010 | Crowley et al. | 702/19 |
| 2002/0169563 | A1 * | 11/2002 | de Carvalho Ferreira | 702/20 |
| 2006/0218512 | A1 * | 9/2006 | Arslan et al. | 716/4 |

OTHER PUBLICATIONS

"A parallel hybrid genetic algorithm for the vehicle routing problem with time windows". Berger, Jean, et al. 2003 Elsevier Ltd.*
"A New Hybrid Evolutionary Algorithm for the Vehicle Routing Problem with Time Windows". Braysy O, Berger J, Barkaoui M. Presented in Route 2000 Workshop, Skodsborg, Denmark, 2000.*
"Evolution of Grap-like Programs with Parallel Distributed Genetic Programming". Poli, Ricardo. University of Birmingham. 1997.*
Jeremy J. Michalek, Ruchi Choudhary and Panos Y. Papalambros—Architectural Layout Design Optimization Enf. Opt., 2002, vol. 34(5), pp. 461-484.

* cited by examiner

*Primary Examiner* — Jason Proctor
*Assistant Examiner* — Nithya Janakiraman
(74) *Attorney, Agent, or Firm* — Kauth, Pomeroy, Peck & Bailey LLP

(57) ABSTRACT

Space frames consist of combination of one or more basic modules to function as a decorative feature or a building element in architectural design. There are certain aesthetic criteria to meet on the design of a basic space frame module; space frame module, geometric regularity, and dimension regularity for all the angles and lengths between edges. Designers exercise their own creativity to develop space frame modules base on these criteria. The present invention relates to a hybrid algorithm based on evolutionary algorithm for graph encoding scheme (EAGES) and genetic algorithm (GA) to evolve the design automatically in relative small number of generations. The hybrid algorithm is a tool to architects and designers to rapidly produce aesthetically pleasing designs with the resources available to them.

12 Claims, 14 Drawing Sheets

(a)                                    (b)

(a)                                    (b)

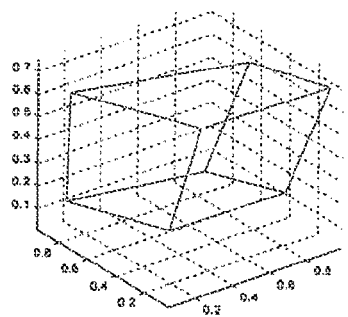
FIG. 5(a) Module A : $|E| = 12$
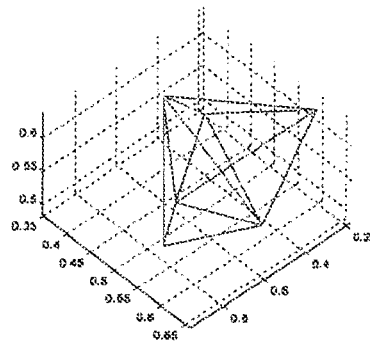
FIG. 5(b) Module B : $|E| = 13$
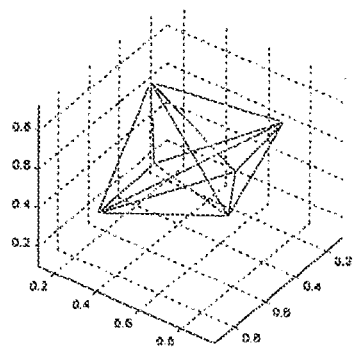
FIG. 5(c) Module C : $|E| = 14$
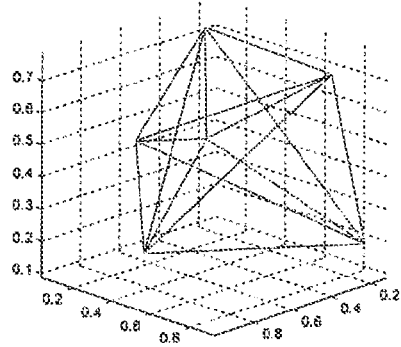
FIG. 5(d) Module D : $|E| = 15$
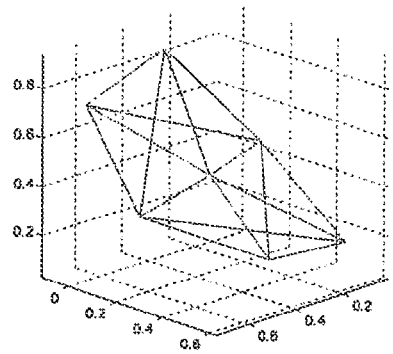
FIG. 5(e) Module E : $|E| = 16$
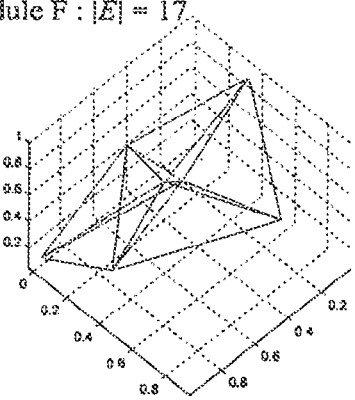
FIG. 5(f) Module F : $|E| = 17$ plan of space frame formed by |E|=13 module plan of space frame formed by |E|=14 module plan of space frame formed by |E|=15 module plan of space frame formed by |E|=16 module plan of space frame formed by |E|=17 module plan of space frame formed by |E|=18 module plan of space frame formed by |E|=19 module plan of space frame formed by |E|=20 module

METHOD FOR AUTOMATIC GENERATION OF OPTIMAL SPACE FRAME

BACKGROUND

The space frame has been widely adopted as an aesthetic design feature in architecture. A simple structure space frame can be used as decorative features such as lanterns and hanging features in shopping malls. Repetition of a space frame structure can form large space frames that constitute major element of a building, for example roof cover, canopy, external wall, and even the whole building enclosure. The process of artistic creation of a space frame within resource constraints has always been an issue to architects and designers. Although there are standard proprietary space frame systems with associated computer-aided design, the variety is limited. The current systems are mainly tools for drafting; an intelligent tool for creating original space frame modules is lacking.

The conventional approach to architectural design is for an architect to receive a briefing from a client on functional requirements. Following, it is then up to the architect's skill to convert the client's requirements into building plans. The conversion process is idiosyncratic and very dependent on the skill level of the architect.

It is an object of the present invention to offer an intelligent system used to design space frame modules within resource constraints. The system includes a hybrid methodology made from two core methods, evolutionary algorithm for graph encoding scheme (EAGES) and genetic algorithm (GA). The tool can evolve space frame modules and three-dimensional geometric figures with small number of generations for convergence.

DESCRIPTION

The present invention proposes a system having a hybrid method made of two core methods, evolutionary algorithm for graph encoding scheme (EAGES) and genetic algorithm (GA), for assisting in the design of space frames modules. The individual methods can be coded in a well-known computer language, for example LISP, Prolog C, C++, Pascal, or FORTRAN. In hybridizing, or joining, the two core methods, the code of one method is positioned following the code of the other method. In this manner, one method will be initiated and proceed, immediately followed by initiating and proceeding to the second method. In this invention, EAGES is positioned first, followed by GA. The system allows designers to design space frames using optimized space frame modules generated by the hybrid method.

The system can include a processor, a memory such as hard disk and/or RAM, user interface device such as keyboard, mouse, display, and power supply. The hybrid method can be coded and stored on the memory.

These and other features, aspects, and advantages of the apparatus and methods of the present invention will become better understood from the following description, appended claims, and accompanying drawings where:

FIG. 1 shows the flow of the hybrid method of creating a three dimensional repeatable space frame module of the present invention.

FIG. 2 exhibits the parent graphs prior to crossover by EAGES method.

The following description of certain exemplary embodiment(s) is merely exemplary in nature and is in no way intended to limit the invention, its application, or uses. Throughout this description, the term "node" shall refer to a basic unit to build linked structures. The term "graph" shall refer to a structure built from a set of linked nodes. A "spanning tree" is a subset of a graph. A spanning tree has $|V|-1$ number of edges connecting all the nodes of the graph, where $|V|$ is the number of nodes of the graph. "Evolutionary algorithm for graph encoding scheme (EAGES)" shall refer to generic population-based metaheuristic optimization algorithms suitable for encoding graphs, involving breaking up of adjacency matrices into submatrices and then swapping to create children. "Genetic algorithm" shall refer to stochastic search algorithms based on biological evolution, involving breaking up of linear chromosomes into parts and swapping to create children.

Figure 1:
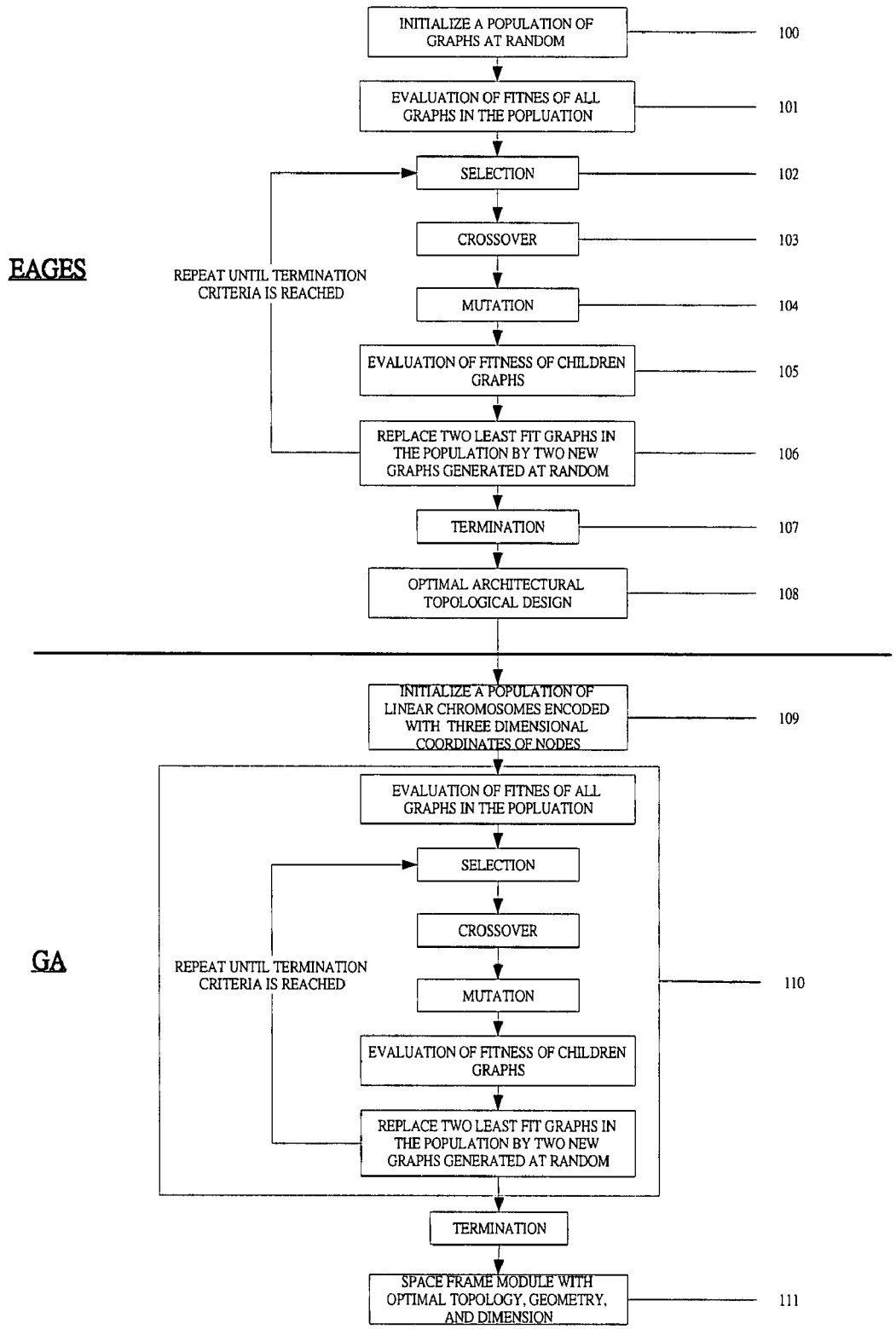

Now, to FIGS. 1-13,

FIG. 1 shows the hybrid method of the present invention for creating a three dimensional space frame module of the present invention. As shown, the hybrid method is broken down into two core methods, evolutionary algorithm for graph encoding scheme (EAGES) and a genetic algorithm (GA).

EAGES is initiated by randomly creating a population of graphs (FIG. 1, 100). EAGES creates each graph by making use of the property that a spanning tree is always embedded in a graph. To create a graph, a spanning tree with random number of nodes is first generated. A graph is then created by random addition of connections between nodes in the spanning tree. In the process of children graph generation, after the swapping of subgraphs in the process of crossover to be described later, a spanning tree is first added at random to connect the nodes of the two subgraphs coming from two different parent graphs. It is then followed by random addition of edges connecting the nodes in each subgraph.

Each graph in the population is evaluated by a fitness function (FIG. 1, 101). The fitness function is designed to measure a graph's closeness to optimum. The higher the fitness of a graph, the closer it is to the optimum.

Two graphs are selected from the population by roulette wheel selection (FIG. 1, 102) to undergo crossovers (FIG. 1, 103) and mutations (FIG. 1, 104). The probability of a graph being selected is proportional to its fitness relative to the average fitness of the population. Hence, the higher the fitness of a graph relative to the population, the more likely will it be selected.

EAGES makes use of an unbiased type of crossover operator (FIG. 1 103), such as a random crossover. This allows two parent graphs with different numbers of nodes to be crossed. In an example, 1. Two graphs, $[G^{P1}(V^{P1}, E^{P1})]$ and $[G^{P2}(V^{P2}, E^{P2})]$, having node sets $\{v_1^{P1}, v_2^{P1}, \ldots v_i^{P1}, v_{i+1}^{P1}, \ldots, v_n^{P1}\}$ and $\{v_1^{P2}, v_2^{P2}, \ldots v_j^{P2}, v_{j+1}^{P2}, \ldots, v_m^{P2}\}$ respectively. For the two graphs, corresponding adjacency matrices $G^{P1}$ and $G^{P2}$ are constructed.

2. A crossover point in each graph ($G^{P1}$ and $G^{P2}$) is randomly selected.

3. Assume that the crossover point for $G^{1P}$ is between $v_i^{P1}$ and $v_{i+1}^{P1}$, and for $G^{P2}$ the crossover point is between $v_j^{P2}$ and $v_{j+1}^{P2}$, the lower right portions of these two adjacency matrices are then swapped so that the rows and columns corresponding to $\{v_{i+1}^{P1}, \ldots, v_n^{P1}\}$ are swapped with the rows and columns corresponding to $\{v_{j+1}^{P2}, \ldots, v_m^{P2}\}$ to form two matrices, $G^{PC12}$ and $G^{PC21}$. The valid node labels for $G^{PC12}$ are therefore given by $\{v_1^{P1}, v_2^{P1}, \ldots, v_i^{P1}, v_{j+1}^{P2}, \ldots v_m^{P2}\}$ and for $G^{PC21}$ by $\{v_1^{P2}, v_2^{P2}, \ldots, v_j^{P2}, v_{i+1}^{P1}, \ldots v_n^{P1}\}$.

4. All cell entries in each of $G^{PC12}$ and $G^{PC21}$ are scanned to remove invalid edges.

5. The number of edges to be added to each of $G^{PC12}$ and $G^{PC21}$ respectively to form children graphs $G^{C1}$ and $G^{C2}$ are then decided with a random number generator so that, $$|v^{PC12}| - 1 \le |E^{C1}| \le \binom{|v^{PC12}|}{2}$$

and $$|v^{PC21}| - 1 \le |E^{C2}| \le \binom{|v^{PC21}|}{2},$$

where $|E^{C1}|$, $|E^{C2}|$ are the number of edges of $G^{C1}$ and $G^{C2}$ respectively.

6. A random spanning tree is constructed in each matrix and the remaining edges to be added are generated randomly in such a way that they connect nodes from $\{v_1^{P1}, v_2^{P1}, \ldots v_i^{P1}\}$ with those from $\{v_{j+1}^{P2}, \ldots, v_m^{P2}\}$, and from $\{v_1^{P2}, v_2^{P2}, \ldots v_j^{P2}\}$ with those from $\{v_{i+1}^{P1}, \ldots, v_n^{P1}\}$.

7. Once edge-generation is complete, two children graphs, $G^{C1}$ and $G^{C1}$, are produced.

Figure 2:
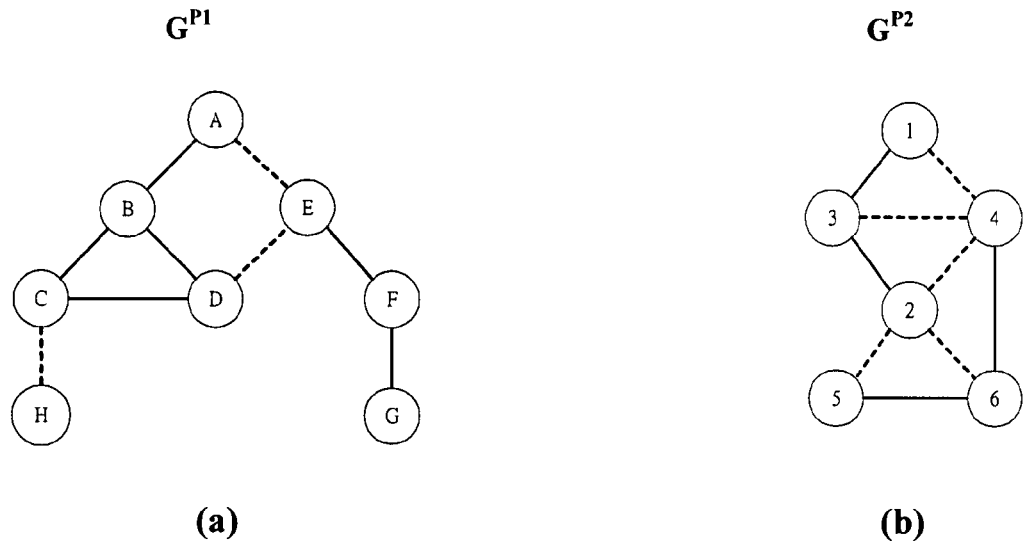

FIG. 2, (*a* and *b*), used in conjunction with Tables 1 and 2, exhibits the above described EAGES method.

To FIG. 2(*a*), a crossover point is randomly chosen for $G^{P1}$ (Table 1); to FIG. 2(*b*), a crossover point is randomly chosen for $G^{P2}$ (Table 2). The dotted lines represent the break line that split the nodes of each of the two graphs into two groups for swapping in the next stage.

TABLE 1 with reference to FIG. 2(a).
$G^{P1}$

|   | A | B | C | D | E | F | G | H |
|---|---|---|---|---|---|---|---|---|
| A | - | 1 | 0 | 0 | 1 | 0 | 0 | 0 |
| B |   | - | 1 | 1 | 0 | 0 | 0 | 0 |
| C |   |   | - | 1 | 0 | 0 | 0 | 1 |
| D |   |   |   | - | 1 | 0 | 0 | 0 |
| E |   |   |   |   | - | 1 | 0 | 0 |
| F |   |   |   |   |   | - | 1 | 0 |
| G |   |   |   |   |   |   | - | 0 |
| H |   |   |   |   |   |   |   | - |

TABLE 2 with reference to FIG. 2(b).
$G^{P2}$

|   | 1 | 2 | 3 | 4 | 5 | 6 |
|---|---|---|---|---|---|---|
| 1 | - | 0 | 1 | 1 | 0 | 0 |
| 2 |   | - | 1 | 1 | 1 | 1 |
| 3 |   |   | - | 1 | 0 | 0 |
| 4 |   |   |   | - | 0 | 1 |
| 5 |   |   |   |   | - | 1 |
| 6 |   |   |   |   |   | - |

Table 3 and 4 show the effects of swapping of lower right portions of $G^{P1}$ and $G^{P2}$ after the removal of invalid edges between node sets {A, B, C, D} and {E, F, G, H} in $G^{P1}$, and between node sets {1, 2, 3} and {4, 5, 6} in $G^{P2}$.

TABLE 3

$G^{PC12}$

|   | A | B | C | D | 4 | 5 | 6 |
|---|---|---|---|---|---|---|---|
| A | - | 1 | 0 | 0 | 0 | 0 | 0 |
| B |   | - | 1 | 1 | 0 | 0 | 0 |
| C |   |   | - | 1 | 0 | 0 | 0 |
| D |   |   |   | - | 0 | 0 | 0 |
| 4 |   |   |   |   | - | 0 | 1 |
| 5 |   |   |   |   |   | - | 1 |
| 6 |   |   |   |   |   |   | - |

TABLE 4

$G^{PC21}$

|   | 1 | 2 | 3 | E | F | G | H |
|---|---|---|---|---|---|---|---|
| 1 | - | 0 | 1 | 0 | 0 | 0 | 0 |
| 2 |   | - | 1 | 0 | 0 | 0 | 0 |
| 3 |   |   | - | 0 | 0 | 0 | 0 |
| E |   |   |   | - | 1 | 0 | 0 |
| F |   |   |   |   | - | 1 | 0 |
| G |   |   |   |   |   | - | 0 |
| H |   |   |   |   |   |   | - |

Figure 3:
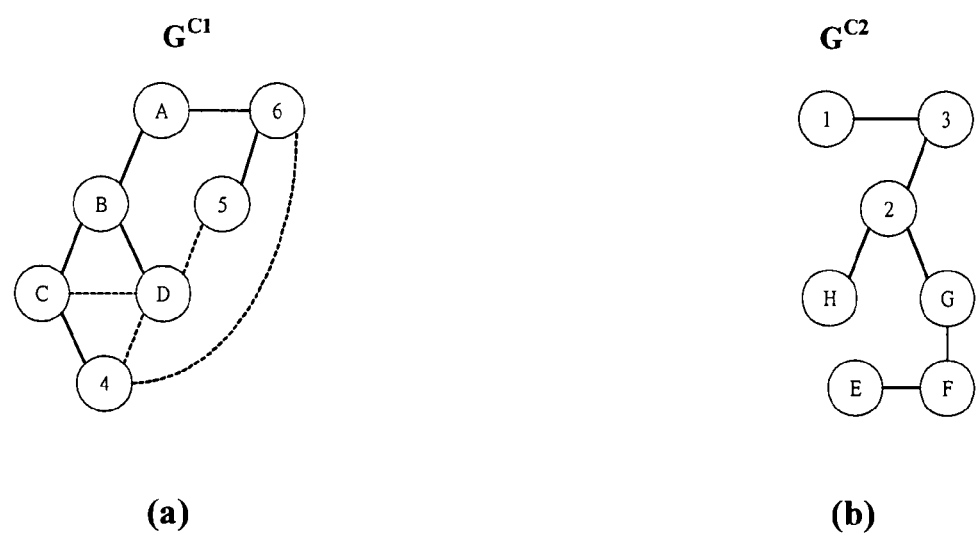
FIG. 3 shows the children graphs generated by crossover by EAGES method.

A spanning tree is constructed at random and other valid edges are added randomly to form two children adjacency matrices, $G^{C1}$ and $G^{C2}$, as shown FIG. 3 (*a* and *b*), and Tables 5 and 6. The spanning trees are shown in solid edges in FIG. 3(*a* and *b*) and bold '1's in Table 5 and 6.

TABLE 5 with reference to FIG. 3(a).
$G^{C1}$

|   | A | B | C | D | 4 | 5 | 6 |
|---|---|---|---|---|---|---|---|
| A | - | 1 | 0 | 0 | 0 | 0 | 1 |
| B |   | - | 1 | 1 | 0 | 0 | 0 |
| C |   |   | - | 1 | 1 | 0 | 0 |
| D |   |   |   | - | 1 | 1 | 0 |
| 4 |   |   |   |   | - | 0 | 1 |
| 5 |   |   |   |   |   | - | 1 |
| 6 |   |   |   |   |   |   | - |

TABLE 6 with reference to FIG. 3(b).
$G^{C2}$

|   | 1 | 2 | 3 | E | F | G | H |
|---|---|---|---|---|---|---|---|
| 1 | - | 0 | 1 | 0 | 0 | 0 | 0 |
| 2 |   | - | 1 | 0 | 0 | 1 | 1 |
| 3 |   |   | - | 0 | 0 | 0 | 0 |
| E |   |   |   | - | 1 | 0 | 0 |
| F |   |   |   |   | - | 1 | 0 |
| G |   |   |   |   |   | - | 0 |
| H |   |   |   |   |   |   | - |

A mutation operator is then utilized (FIG. 1, 104), which can be selected from the group consisting of number-of-edge mutation operator, node-label mutation operator, and swap-node mutation operator.

The number-of-edge mutation operator allows the increase or decrease the number of edges in a graph by one. It works by randomly selecting or adding an edge, as shown in Tables 7 and 8:

TABLE 7

|   | A | B | C | D | E | F | G | H |
|---|---|---|---|---|---|---|---|---|
| A | — | 1 | 0 | 0 | 1 | 0 | 0 | 0 |
| B |   | — | 1 | 1 | 0 | 0 | 0 | 0 |
| C |   |   | — | 1 | 0 | 0 | 0 | 1 |
| D |   |   |   | — | 1 | 0 | 0 | 0 |
| E |   |   |   |   | — | 1 | 0 | 0 |
| F |   |   |   |   |   | — | 1 | 0 |
| G |   |   |   |   |   |   | — | 0 |
| H |   |   |   |   |   |   |   | — |

(a) Step 1. Select an edge connecting B and D.

TABLE 8

|   | A | B | C | D | E | F | G | H |
|---|---|---|---|---|---|---|---|---|
| A | — | 1 | 0 | 0 | 1 | 0 | 0 | 0 |
| B |   | — | 1 | 0 | 0 | 0 | 0 | 0 |
| C |   |   | — | 1 | 0 | 0 | 0 | 1 |
| D |   |   |   | — | 1 | 0 | 0 | 0 |
| E |   |   |   |   | — | 1 | 0 | 0 |
| F |   |   |   |   |   | — | 1 | 0 |
| G |   |   |   |   |   |   | — | 0 |
| H |   |   |   |   |   |   |   | — |

(b) Step 2. Delete the edge selected.

The number-of-node mutation operator allows us to increase or decrease the number of nodes in a graph by one. It works by selecting a node at random for deletion or addition, as shown in Tables 9 and 10:

TABLE 9

|   | A | B | C | D | E | F | G | H |
|---|---|---|---|---|---|---|---|---|
| A | — | 1 | 0 | 0 | 1 | 0 | 0 | 0 |
| B |   | — | 1 | 1 | 0 | 0 | 0 | 0 |
| C |   |   | — | 1 | 0 | 0 | 0 | 1 |
| D |   |   |   | — | 1 | 0 | 0 | 0 |
| E |   |   |   |   | — | 1 | 0 | 0 |
| F |   |   |   |   |   | — | 1 | 0 |
| G |   |   |   |   |   |   | — | 0 |
| H |   |   |   |   |   |   |   | — |

(a) Step 1. Select the node B.

TABLE 10

|   | A | C | D | E | F | G | H |
|---|---|---|---|---|---|---|---|
| A | — | 0 | 0 | 1 | 0 | 0 | 0 |
| C |   | — | 1 | 0 | 0 | 0 | 1 |
| D |   |   | — | 1 | 0 | 0 | 0 |
| E |   |   |   | — | 1 | 0 | 0 |
| F |   |   |   |   | — | 1 | 0 |
| G |   |   |   |   |   | — | 0 |
| H |   |   |   |   |   |   | — |

(b) Step 2. Delete the selected node.

The node-label mutation operator allows us to replace one node by another in the same graph. It works by selecting a node to be replaced and a node to replace it at random, as in tables 11 and 12:

TABLE 11

|   | A | B | C | D | E | F | G | H |
|---|---|---|---|---|---|---|---|---|
| A | — | 1 | 0 | 0 | 1 | 0 | 0 | 0 |
| B |   | — | 1 | 1 | 0 | 0 | 0 | 0 |
| C |   |   | — | 1 | 0 | 0 | 0 | 1 |
| D |   |   |   | — | 1 | 0 | 0 | 0 |
| E |   |   |   |   | — | 1 | 0 | 0 |
| F |   |   |   |   |   | — | 1 | 0 |
| G |   |   |   |   |   |   | — | 0 |
| H |   |   |   |   |   |   |   | — |

Step 1. Select C to be replaced by F.

TABLE 12

|   | A | B | F | D | E | F | G | H |
|---|---|---|---|---|---|---|---|---|
| A | — | 1 | 0 | 0 | 1 | 0 | 0 | 0 |
| B |   | — | 1 | 1 | 0 | 0 | 0 | 0 |
| F |   |   | — | 1 | 0 | 0 | 0 | 1 |
| D |   |   |   | — | 1 | 0 | 0 | 0 |
| E |   |   |   |   | — | 1 | 0 | 0 |
| F |   |   |   |   |   | — | 1 | 0 |
| G |   |   |   |   |   |   | — | 0 |
| H |   |   |   |   |   |   |   | — |

(b) Step 2. Replace C with F.

The swap-node mutation operator allows the swap of two nodes in the same graph. It selects a pair of nodes to be swapped at random and then swap the nodes as follows (see tables 13 and 14):

TABLE 13

|   | A | B | C | D | E | F | G | H |
|---|---|---|---|---|---|---|---|---|
| A | — | 1 | 0 | 0 | 1 | 0 | 0 | 0 |
| B |   | — | 1 | 1 | 0 | 0 | 0 | 0 |
| C |   |   | — | 1 | 0 | 0 | 0 | 1 |
| D |   |   |   | — | 1 | 0 | 0 | 0 |
| E |   |   |   |   | — | 1 | 0 | 0 |
| F |   |   |   |   |   | — | 1 | 0 |
| G |   |   |   |   |   |   | — | 0 |
| H |   |   |   |   |   |   |   | — |

(a) Step 1. Select two nodes to be swapped.

TABLE 14

|   | A | B | F | D | E | C | G | H |
|---|---|---|---|---|---|---|---|---|
| A | — | 1 | 0 | 0 | 1 | 0 | 0 | 0 |
| B |   | — | 1 | 1 | 0 | 0 | 0 | 0 |
| F |   |   | — | 1 | 0 | 0 | 0 | 1 |
| D |   |   |   | — | 1 | 0 | 0 | 0 |
| E |   |   |   |   | — | 1 | 0 | 0 |
| C |   |   |   |   |   | — | 1 | 0 |
| G |   |   |   |   |   |   | — | 0 |
| H |   |   |   |   |   |   |   | — |

(b) Step 2. Swap the nodes.

Fitness of the children created by crossover and mutation are evaluated (FIG. 1, 105).

After the evaluations, the two graphs with the lowest fitness in the population will be replaced by two new randomly generated graphs (FIG. 1, 106). The process from selection (FIG. 1, 102) to replacement of the two least fit graphs in the population (FIG. 1, 106) repeats until the termination criterion is reached (FIG. 1, 107). The termination criterion is either a fixed number of repetitions of the above process or when the optimal solution is found by reaching the target fitness.

In one embodiment on space frame module topology design, termination criterion is either the attainment of optimal fitness or repeating the selection, crossover and mutation process for 100 generations or when the target fitness of 1 is reached.

Given a fixed number of edges, EAGES is used to find possible optimal topologies of a space frame module (see FIG. 1, 105) in a design process so that, instead of having to deal with too many feasible but non-optimal space frame topologies, designers need only deal with the optimized ones before starting the next stage, which is geometric design.

Example 1

EAGES Application on Designing Architectural Topology Using Function Spaces of a House To find optimal architectural topological designs for an architectural function space, a fitness function in EAGES takes into consideration a client's preferences as given in an adjacency preference matrix in Table 15. The function spaces are encoded as nodes in a graph. The higher the adjacency preference score (APS) between two function spaces, the more preferred they are adjacent to each other. There is a limit to the number of function spaces adjacent to an individual function space. It is expressed as the valence of a node in a graph representation. In addition, budget constraint, the range of relative ratios between rooms, and the minimum functions that are required to constitute an acceptable design are considered. The maximum valence of a node, the cost of providing each node are given in table 16, and the acceptable range of relative room ratios are given in table 17:

TABLE 15

Adjacency Preference Matrix showing adjacency preference score between function spaces

|   | 1. SA | 2. MA | 3. BED | 4. LR | 5. D&K | 6. B | 7. CP | 8. P | 9. CIR | 10. EXT |
|---|---|---|---|---|---|---|---|---|---|---|
| 1. Study area (SA) | −2 | 2 | 1 | −2 | −2 | −2 | −2 | −1 | 3 | 3 |
| 2. Master ensuite (ME) | 2 | −2 | 2 | −2 | −2 | −2 | −2 | 3 | 3 | 3 |
| 3. Bedroom (BED) | 1 | 2 | 2 | −2 | −2 | 3 | −2 | 1 | 3 | 3 |
| 4. Living room (LR) | −2 | −2 | −2 | −2 | 1 | 2 | 1 | 3 | 3 | 3 |
| 5. Dining & kitchen (D&K) | −2 | −2 | −2 | 1 | −2 | 2 | −2 | 1 | 3 | 2 |
| 6. Bathroom (B) | −2 | −2 | 3 | 2 | 2 | 3 | −2 | −2 | 3 | 1 |
| 7. Car park (CP) | −2 | −2 | −2 | 1 | −2 | −2 | −2 | −2 | 3 | 3 |
| 8. Patio (P) | −1 | 3 | 1 | 3 | 1 | −2 | −2 | −2 | −2 | 3 |
| 9. Hall/stair/circulation area (CIR) | 3 | 3 | 3 | 3 | 3 | 3 | 3 | −2 | 3 | −2 |
| 10. Exterior (EXT) | 3 | 3 | 3 | 3 | 2 | 1 | 3 | 3 | −2 | 3 |

TABLE 16

The function space description corresponding to the labels

| Label | Functional Space | Max. Valence | Cost |
|---|---|---|---|
| 1 | Study area | 4 | 3 |
| 2 | Master ensuite | 4 | 4 |
| 3 | Bedroom | 4 | 3 |
| 4 | Living room | 4 | 6 |
| 5 | Dining and kitchen | 4 | 5 |
| 6 | Bathroom | 4 | 2 |
| 7 | Carpark | No limit | 1 |
| 8 | Patio | No limit | 4 |
| 9 | Hall/stair/circulation area | 6 | 4 |
| 10 | Exterior | No limit | 0 |

TABLE 17

The relative Room Ratios

| Function 1/Function 2 | Min. Ratio | Max. Ratio |
|---|---|---|
| Study area/Master ensuite | 0 | 1 |
| Study area/Bedroom | 0 | 1 |
| Study area/Patio | 0 | 4 |
| Master ensuite/Patio | 1 | 2 |
| Bedroom/Living room | 1 | 3 |
| Bedroom/Bathroom | 1 | 2 |
| Bedroom/Patio | 1 | 4 |
| Living room/Bathroom | 1 | 2 |
| Living room/Patio | 1 | 2 |

The lowest range of budget allowed for the experiments is 30 to 34. The second range is 35 to 39 and so forth until the budget reaches the range from 55 to 59. EAGES is applied to search for the topologies that maximize the APS within the budget range and the valance constraints of individual nodes. The fitness function is defined as $$\text{Fitness} = \frac{X}{Z^{a+b+c+d}}$$

Where x=sum of the adjacency preference (APS)

a=absolute deviation to the budget range b=total valence exceeding the maximum allowed for each node c=total absolute deviation to the allowed range of room ratios d=number of function spaces deficient in the graph The APS is the value to be maximized, and the deviations to the other assigned constraints a, b, c, and d are the values to be minimized. The denominator is made an exponential function to eliminate the mathematical indeterminate case when all factors equal zero. When all the imposed constraints are satisfied, the values of a, b, c, and d will be 0. As such, the fitness value equals APS.

Once terminated, the optimal graph can be decoded and the floor plans can be drawn. Using the optimal architectural space topology, an architect can insert his or her favorite architectural motifs to complete the design.

As an example, the change of maximum fitness with respect to number of generations for experiment on budget range between 30 and 34 is shown in Table 18. The maximum fitness is stagnant upon reach the optimal. The experiment results on different budget ranges are summarized in Table 19.

TABLE 18

Maximum fitness with respect to number of generations

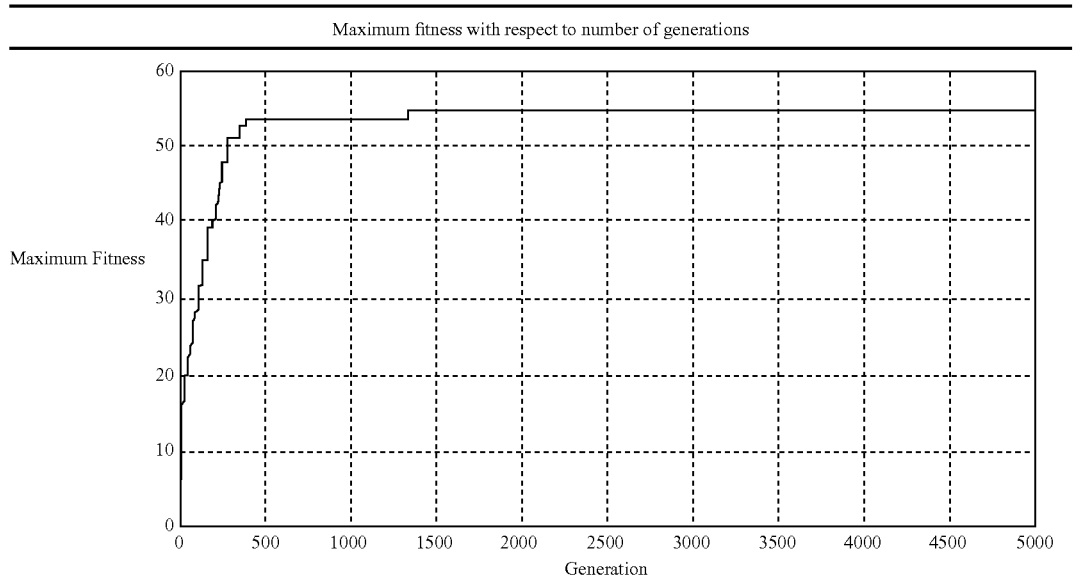

TABLE 19

Experiment results

| Experiment | Budget Range | No. of Nodes | Converging Generation | APS | Cost | APS/Cost 5 |
|---|---|---|---|---|---|---|
| 1 | 30-34 | 10 | 1312 | 55 | 32 | 1.719 |
| 2 | 35-39 | 11 | 611 | 64 | 36 | 1.778 |
| 3 | 40-44 | 12 | 1536 | 74 | 40 | 1.85 |
| 4 | 45-49 | 13 | 1036 | 74 | 45 | 1.644 |
| 5 | 50-54 | 15 | 1294 | 108 | 52 | 2.077 |
| 6 | 55-59 | 16 | 2101 | 113 | 57 | 1.982 |

Example 2

EAGES Application on Space Frame Module Topology Design

Figure 4A:
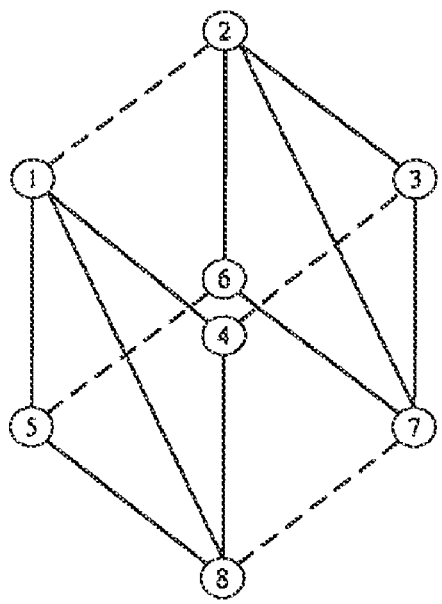
FIG. 4 shows the symmetry of a space frame module and the assignment of three-dimensional coordinates to a space frame module.
Figure 4B:
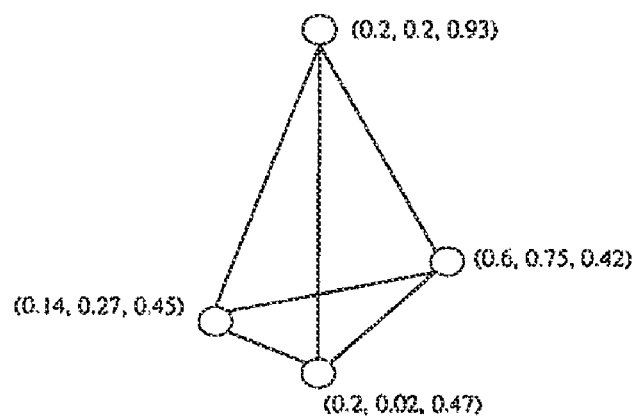
Figure 4C:
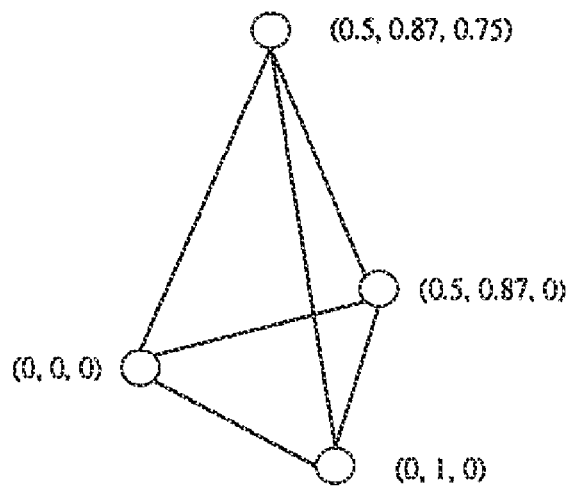
Figure 4D:
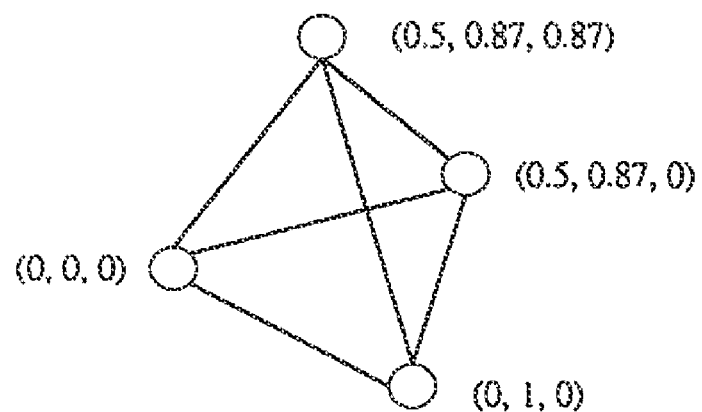

A space frame module has symmetric topology. FIG. 4a illustrates an example of a cubical symmetric space frame topology. Subgraph with node set {1, 4, 5, 8} is symmetric to subgraph with node set {2, 3, 6, 7}. For convenience of computation, both the upper and lower triangle matrix is used. This space frame module is presented in the symmetric adjacency matrix shown in Table 20. The adjacency matrix is subdivided into 4 sub-matrices by dotted lines in Table 20.

TABLE 20

Adjacency matrix for space frame module in FIG. 4a.

|   | 1 | 4 | 8 | 5 | 2 | 3 | 7 | 6 |
|---|---|---|---|---|---|---|---|---|
| 1 | 0 | 1 | 1 | 1 | 1 | 0 | 0 | 0 |
| 4 | 1 | 0 | 1 | 0 | 0 | 1 | 0 | 0 |
| 8 | 1 | 1 | 0 | 1 | 0 | 0 | 1 | 0 |
| 5 | 1 | 0 | 1 | 0 | 0 | 0 | 0 | 1 |
| 2 | 1 | 0 | 0 | 0 | 0 | 1 | 1 | 1 |
| 3 | 0 | 1 | 0 | 0 | 1 | 0 | 1 | 0 |
| 7 | 0 | 0 | 1 | 0 | 1 | 1 | 0 | 1 |
| 6 | 0 | 0 | 0 | 1 | 1 | 0 | 1 | 0 |

Define A as upper left portion sub-matrix, B as upper right portion sub-matrix, C as the lower right portion sub-matrix, D as the lower left portion sub-matrix. The symmetric property of the space frame module is reflected in properties of the sub-matrices as $A=C$, $B=D^T$ where $D^T$ is the transpose of D. Let $N(A \cap C)$=number of corresponding slots having '1' in both matrices A and C $N(A \cup C)$=number of corresponding slots having '1' in either matrices A or C Define correlation coefficient between two adjacency matrices A and C as $$c^{AC} = \frac{N(A \cap C)}{N(A \cup C)}.$$

$$0 \leq c^{AC} \leq 1$$

For any adjacency matrix for a space frame, the higher the value of $c^{AC}$ and $c^{BD^T}$, the more the degree of symmetry. Both $c^{AC}$ and $c^{BD^T}$ should be maximized in the EAGES fitness function. For a symmetric space frame module presented in adjacency matrix, $c^{AC}=c^{BD^T}=1$.

EAGES is applied to evolve symmetric space frame topologies with a given target number of edges, $|E_T|$. The fitness function is defined as $$\text{Fitness} = \frac{2}{2^{||E|-|E_T||} + 2^{|c-1|}}$$

where $|E|$=the number of edge of the space frame module in the course of EAGES evolution $|E_T|$=target number of edge of the space frame module $c=0.5\ c^{AC}+0.5\ c^{BD^T}\ 0\ c, c^{AC}, c^{BD^T}\ 1$ $||E|-|E_T||$ and $|c-1|$ is the value to be minimized. When symmetric space frame with $|E_T|$ number of edges is evolved, $||E|-|E_T||=0$, $|c-1|=0$, and hence, Fitness=1.

As an example, the maximum fitness is plotted against number of generations on applying EAGES on evolution of symmetric space frame module topology with 20 edges, $|E_T|=20$, is shown in Table 21. EAGES terminates when optimal is reached at the 61st generation. The result of experiments with different number of edges is shown in Table 22. Optimal solution can be reached with small number of generations.

TABLE 21

Maximum fitness with respect to number of generations

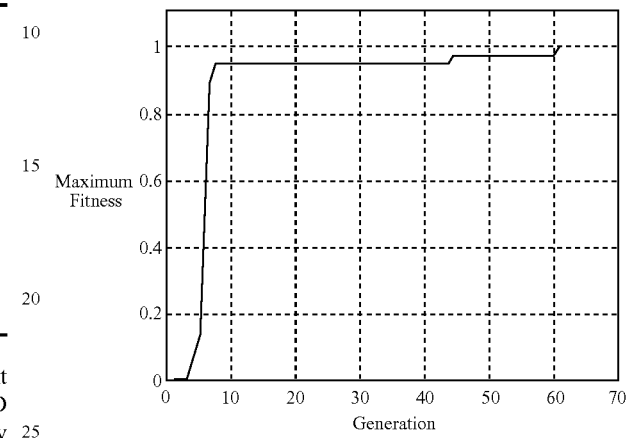

TABLE 22

Experiment results

| No. of edges $|E_T|$ | No. of generations to reach optimal topology (c = 1) |
|---|---|
| 12 | 16 |
| 13 | 21 |
| 14 | 6 |
| 15 | 4 |
| 16 | 50 |
| 17 | 9 |
| 18 | 27 |
| 19 | 18 |
| 20 | 61 |

Following obtaining optimal topological design through EAGES, the appropriate geometric properties and dimensions for the space frame module is obtained through genetic algorithms (GA). As stated previously, EAGES and GA are hybridized with each other. Hybridization occurs by joining the algorithmic functions of both EAGES and GA into one method. The hybrid method can be stored on a memory, such as hard disks or RAM, such memory being stored in a housing, for example a computer system.

Geometric properties of a space frame module to be optimized are the lengths of the edges and the space frame module's internal angles. The target is to achieve regularity of lengths of edges and the internal angles.

Example 3

GA Application on Optimal Space Frame Module Topology Created by EAGES

Entropy calculation on internal angles, $H_A$, and lengths of edges, $H_L$, are used in this respect where $0 \leq H_A$, $H_L \leq 1$.

To illustrate the value of entropies in relation to the regularity of lengths of edges and angles, three-dimensional coordinates are assigned to the nodes in FIG. 4(b, c, and d). Their edge lengths, angles between adjacent edges, length entropies, and angle entropies are summarized in Table 23. It can be observed that the more regular the geometry, the more $H_A$ and $H_L$ approaches 1. And for space frame module with perfect regular geometry in FIG. 3(d), both $H_A$ and $H_L$ equals 1.

TABLE 23

|  | FIG. 3(b) | FIG. 3(c) | FIG. 3(d) |
|---|---|---|---|
| Length Set | 0.26, 2 × 0.50, 0.66, 0.84, 0.85 | 3 × 1.00, 3 × 2.00 | 6 × 1.00 |
| Angle Set (radians) | 0.27, 0.54, 0.60, 0.62, 0.73, 0.89, 1.2, 3 × 1.3, 2.1 | 3 × 0.50, 9 × 1.32 | 12 × 1.05 |
| $H_L$ | 0.9642 | 0.9684 | 1 |
| $H_A$ | 0.9524 | 0.9759 | 1 |

Let A be the set of angles between all adjacent edges in radians
L be the set of lengths of all edges
E(A) be the mean of all angles between all adjacent edges
$H_A$=angle entropy
$H_L$=length entropy
Define fitness function of GA as follow.

$$\text{Fitness}=E(A)H_A H_L$$

To achieve regularity of geometry and dimensions, both $H_A$ and $H_L$ should be maximized. E(A) is maximized to prevent the space frame module from collapsing.

In starting the GA process, random three-dimensional coordinates are assigned to the nodes of the optimal graph. The three-dimensional coordinates of all the nodes are encoded into a linear chromosome before GA process. The linear chromosome is discussed below.

Let $x_i$, $y_i$, $z_i$ be the three-dimensional coordinate of node i. All the coordinates are encoded into a linear chromosome in the following form. Without loss of generality, the values of the coordinates are restricted to $0 \leq x_i, y_i, z_i \leq 1$

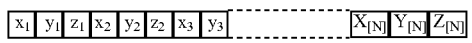

A population of linear chromosomes is initialized at random (FIG. 1, 109). The chromosomes are equal in length because they encode the same optimal topology of the space frame module generated by EAGES. Each chromosome in the population is evaluated with the fitness function. Two chromosomes are selected from the population by roulette wheel selection to undergo crossover and mutations. The probability of a chromosome being selected is proportional to its fitness relative to the average fitness of the population. In one embodiment uniform crossover and uniform mutation are adopted. In uniform crossover, random number of slots in a parent chromosome is selected to swap with its corresponding counter parts in the other parent chromosome to produce two children chromosomes. Each slot in the chromosome has equal chance of being swapped. In uniform mutation, a random number of slots in a chromosome are selected for random change in value. Fitness of the two children produced by uniform crossover and uniform mutation are evaluated. After the evaluation, the two chromosomes with the lowest fitness in the population will be replaced by two new generated chromosomes (FIG. 1, 110). The process returns to selection again and repeat until the termination criterion is reached (FIG. 1, 111). The termination criterion is either a fixed number of repetition of the above process or the attainment of the optimal solution when the target fitness is reached.

In this embodiment, the maximum number of repetitions is 1000 and the target fitness is 1. The result of experiments with different optimal topology space frame generated from EAGES is summarized in Table 24. Near regular geometries, with $H_A$ and $H_L$ close to 1, are achieved after 1000 generations of GA.

TABLE 24

| No. of edges | Angle Entropy $H_A$ | Length Entropy $H_L$ |
|---|---|---|
| 12 | 0.9918 | 0.9952 |
| 13 | 0.9661 | 0.9835 |
| 14 | 0.9818 | 0.9924 |
| 15 | 0.9860 | 0.9915 |
| 16 | 0.9600 | 0.9836 |
| 17 | 0.9691 | 0.9865 |
| 18 | 0.9385 | 0.9733 |
| 19 | 0.9760 | 0.9884 |
| 20 | 0.9831 | 0.9922 |

Example 4

Space Frame Module Production

Figure 5G:
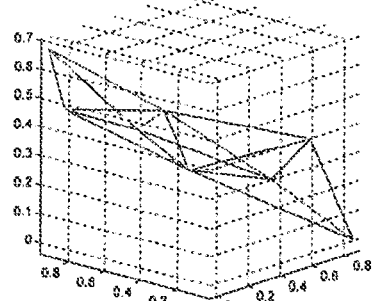
FIG. 5 shows several space frame modules designed using the present invention.
Figure 5H:
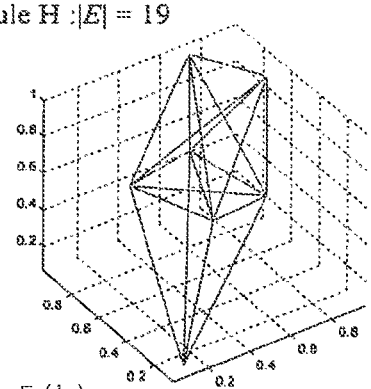
Figure 5I:
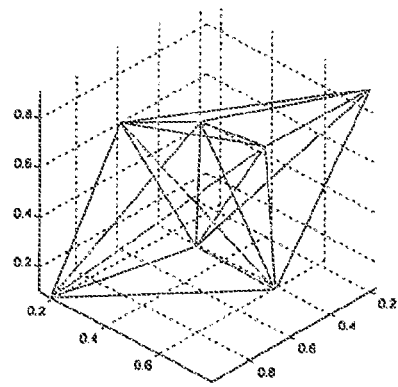
Figure 6:
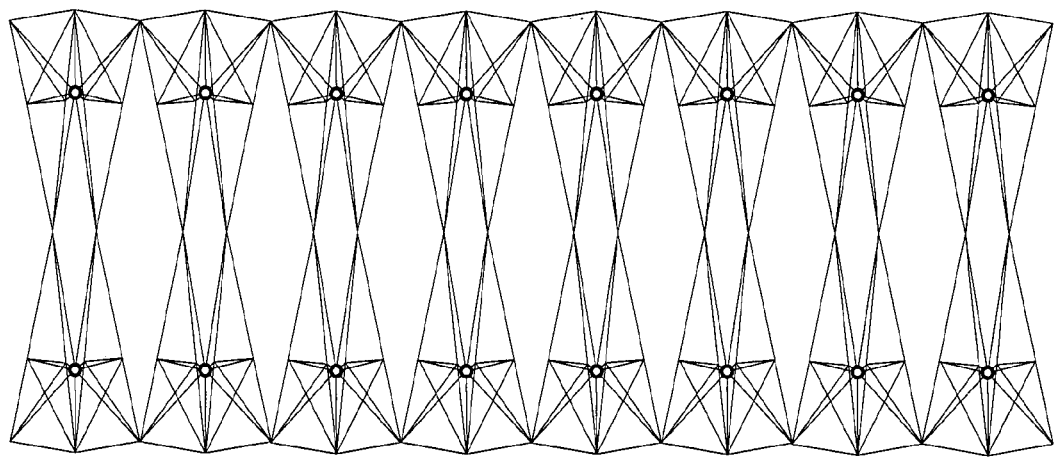
FIG. 6-13 show space frame modules repeated multiple times to form building elements.
Figure 7:
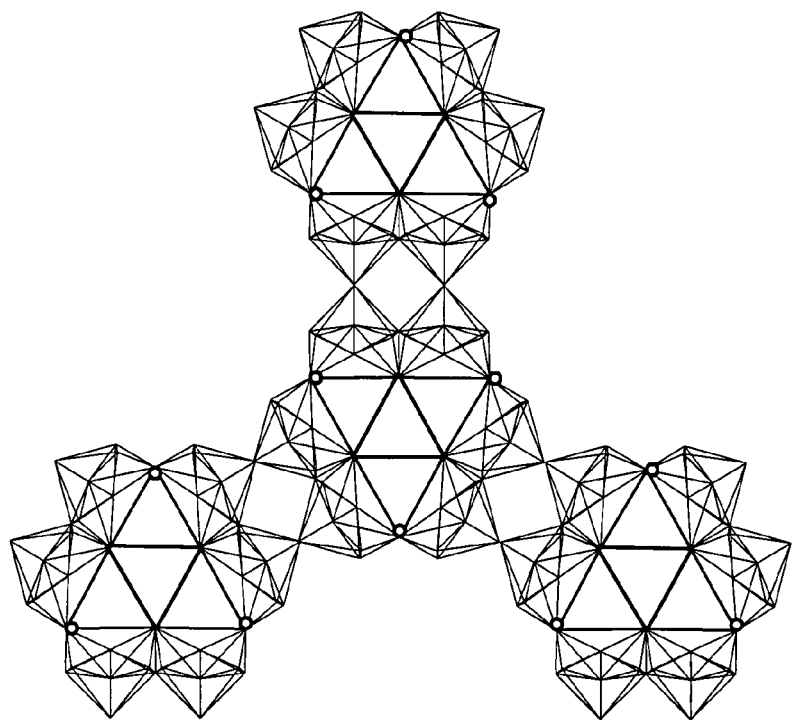
Figure 8:
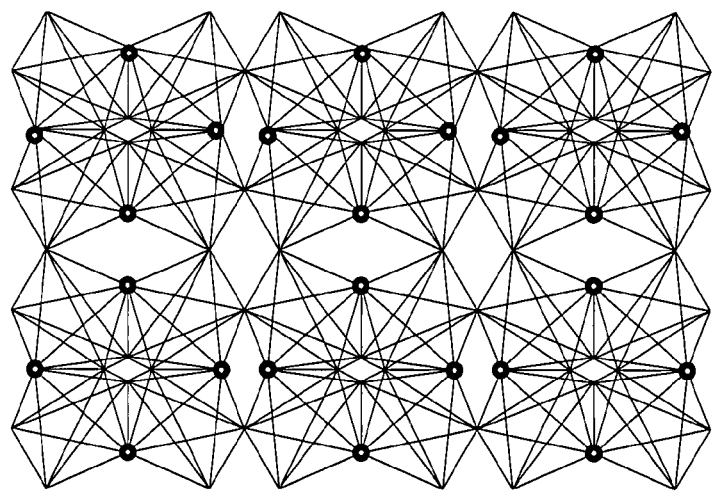
Figure 9:
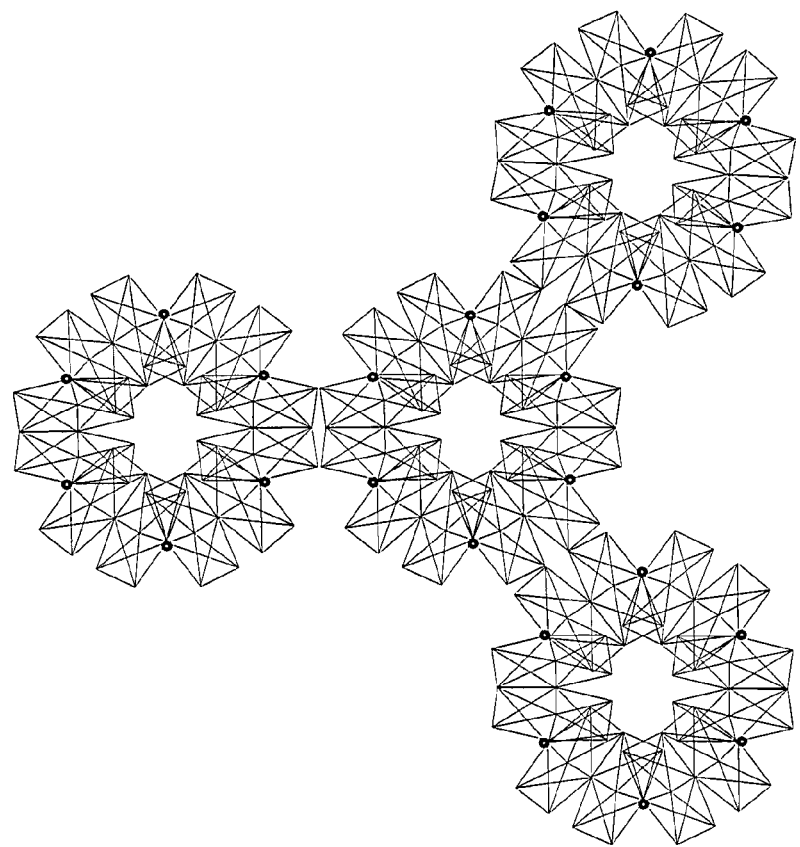
Figure 10:
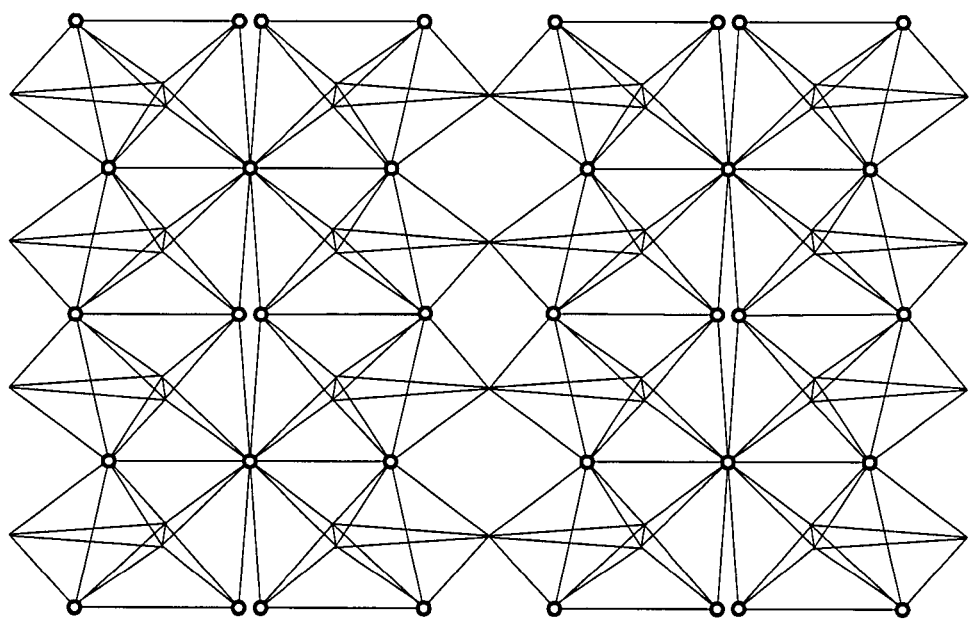
Figure 11:
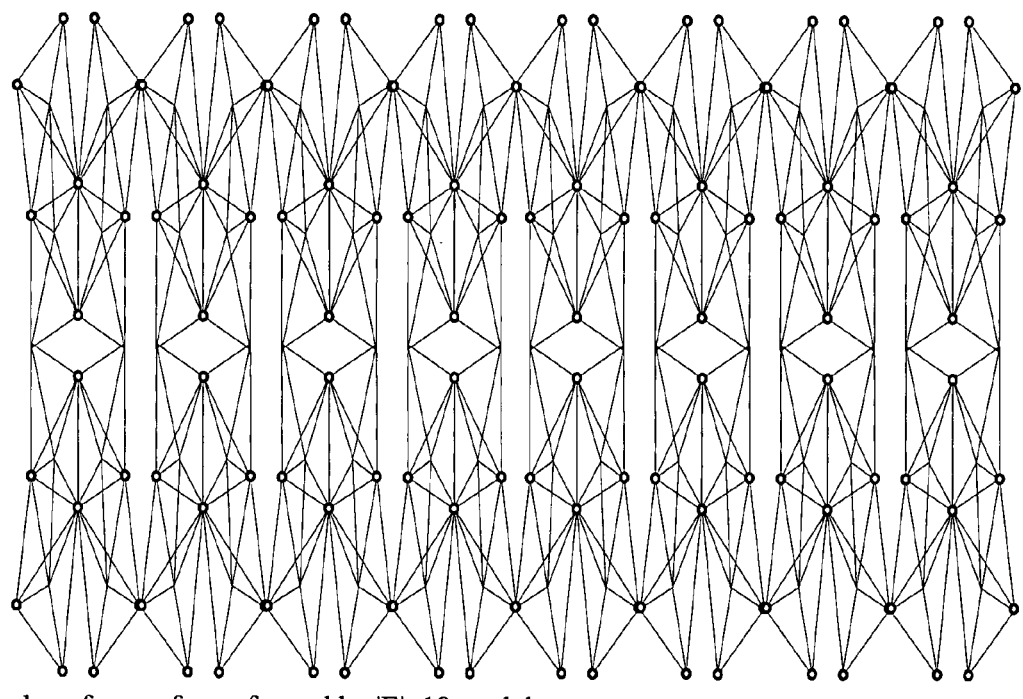
Figure 12:
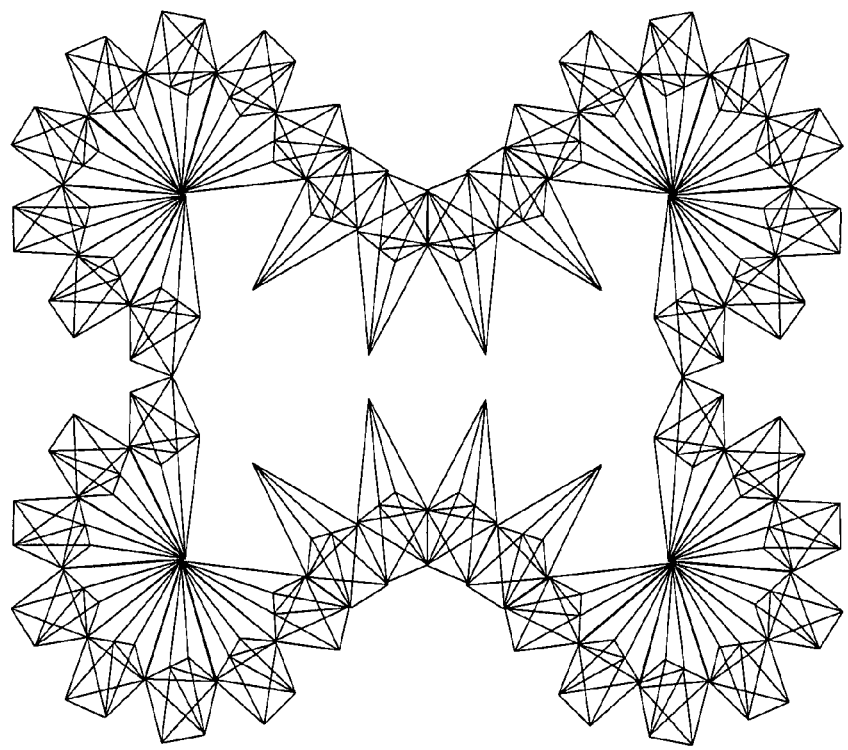
Figure 13:
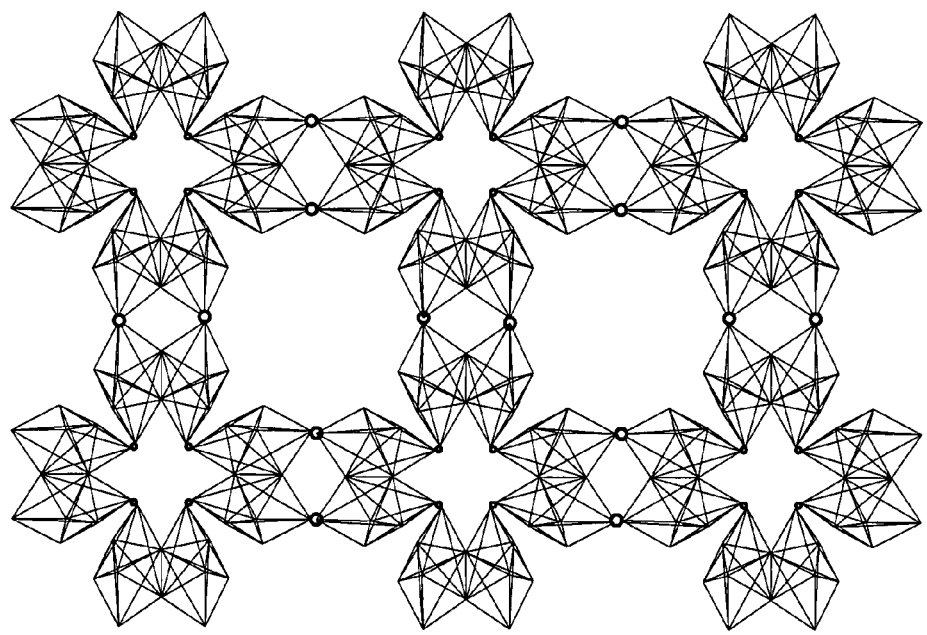

FIG. 5(a-i) shows several space frame modules designed using the hybrid method of the present invention. Design perimeters with number of edges ranging from 12 to 20 are input into the hybrid evolutionary algorithm of the present invention. Near optimal solutions are reached as all the fitness function flattens at near the end of the terminal generation. The designs evolved give a good aesthetic outlook in respect of regularity of geometry and dimensions. As shown, the number of edge |E|, of the module is given.

The space frame modules generated can be combined or articulated to form different types of interesting structures depending on their geometric properties and the functions required by a space.

FIGS. 6-13 shows modules repeated multiple times to form building elements, wherein the |E| number varies to accord to FIG. 5(a-i).

Having described embodiments of the present system with reference to the accompanying drawings, it is to be understood that the present system is not limited to the precise embodiments, and that various changes and modifications may be effected therein by one having ordinary skill in the art without departing from the scope or spirit as defined in the appended claims.

In interpreting the appended claims, it should be understood that:

a) the word "comprising" does not exclude the presence of other elements or acts than those listed in the given claim;

b) the word "a" or "an" preceding an element does not exclude the presence of a plurality of such elements;

c) any reference signs in the claims do not limit their scope;

d) any of the disclosed devices or portions thereof may be combined together or separated into further portions unless specifically stated otherwise; and e) no specific sequence of acts or steps is intended to be required unless specifically indicated.

The invention claimed is:

1. A method of designing space frames with at least four nodes used as an architectural, decorative feature, comprising the steps of:
   randomly initializing a population of graphs;
   encoding each graph in the population into an adjacent matrix;
   operating on said graphs encoded in adjacent matrices using an evolution algorithm for graph encoding scheme (EAGES) which is specifically designed for evolution of adjacent matrices;
   obtaining architecturally optimized topological space frame module designs;
   initializing linear chromosomes on three-dimensional coordinates of said optimized space frame module designs;
   operating on said linear chromosomes using a genetic algorithm (GA); and
   obtaining a space frame module having optimal, topology, geometry, and dimensions.

2. The method according to claim 1, wherein said evolution algorithm for graph encoding scheme (EAGES) comprises utilizing a selection operator, crossover operator, followed by a mutation operator, followed by a termination operator, wherein all operators operate on the adjacent matrices.

3. The method according to claim 2, wherein said selection operator is a roulette wheel selection.

4. The method according to claim 2 wherein said crossover operator is a random crossover in an evolutionary algorithm for graph encoding scheme (EAGES) which operates on the adjacency matrices.

5. The method according to claim 2, wherein said mutation operator is selected from the group consisting of a number-of-edge operator, a node-label operator, and a swap-node operator, wherein all operators operate on the adjacent matrices.

6. The method according to claim 2, wherein said termination operator is conditioned on the target fitness occurring after 100 generations or when 1 is reached.

7. The method according to claim 1, wherein said genetic algorithm incorporates using a selection operator, crossover operator, mutation operator, and termination operator.

8. The method according to claim 7, wherein said selection operator is a roulette wheel selection.

9. The method according to claim 7, wherein said crossover operator is a uniform crossover.

10. The method according to claim 7, wherein said mutation operator is uniform mutation.

11. The method according to claim 7, wherein the termination operator is conditioned on the target fitness occurring to a maximum of 1000 generations or when the target fitness is 1.

12. The method according to claim 1, further comprising the steps of:
    prior randomly initializing a population of graphs;
    hybridizing said evolution algorithm for graph encoding scheme (EAGES) and said genetic algorithm (GA); and
    storing said hybridized algorithms on the memory of a computer system.

* * * * *